(12) United States Patent
Quevy

(10) Patent No.: US 7,816,166 B1
(45) Date of Patent: Oct. 19, 2010

(54) METHOD TO FORM A MEMS STRUCTURE HAVING A SUSPENDED PORTION

(75) Inventor: Emmanuel P. Quevy, El Cerrito, CA (US)

(73) Assignee: Silicon Labs SC, Inc., Sunnyvale, CA (US)

( * ) Notice: Subject to any disclaimer, the term of this patent is extended or adjusted under 35 U.S.C. 154(b) by 622 days.

(21) Appl. No.: 11/716,082

(22) Filed: Mar. 9, 2007

(51) Int. Cl.
*H01L 21/00* (2006.01)
(52) U.S. Cl. .......................... 438/52; 257/415
(58) Field of Classification Search ............. 438/48–98
See application file for complete search history.

(56) References Cited

U.S. PATENT DOCUMENTS

| | | | |
|---|---|---|---|
| 4,838,088 A | 6/1989 | Murakami | |
| 6,846,691 B2 | 1/2005 | Hsu et al. | |
| 7,023,065 B2 | 4/2006 | Ayazi et al. | |
| 7,146,016 B2 | 12/2006 | Pedersen | |
| 2003/0124761 A1* | 7/2003 | Baert et al. | 438/50 |
| 2004/0209435 A1* | 10/2004 | Partridge et al. | 438/381 |
| 2005/0009233 A1 | 1/2005 | Park et al. | |
| 2005/0019974 A1 | 1/2005 | Lutz et al. | |
| 2005/0250236 A1 | 11/2005 | Takeuchi et al. | |
| 2006/0108675 A1 | 5/2006 | Colgan et al. | |
| 2006/0270238 A1* | 11/2006 | Izumi et al. | 438/700 |
| 2006/0273416 A1 | 12/2006 | Ayazi et al. | |
| 2007/0108513 A1* | 5/2007 | Rub et al. | 257/329 |
| 2007/0111365 A1* | 5/2007 | Tateishi et al. | 438/53 |
| 2008/0054759 A1 | 3/2008 | Ayazi et al. | |

OTHER PUBLICATIONS

Lund, Jennifer L. et al., "A Low Temperature Bi-CMOS Compatible Process for MEMS RF Resonators and Filters," Solid-State Sensor, Actuator and Microsystems Workshop, Jun. 2-6, 2002, pp. 38-41.
Jahnes, C. V., et al., "Simultaneous Fabrication of RF MEMS Switches and Resonators Using Copper-Based CMOS Interconnect Manufacturing Methods," IEEE, 2004, pp. 789-792.
Wang, Jing, et al., "1.156-GHZ Self-Aligned Vibrating Micromechanical Disk Resonator," IEEE Transactions on Ultrasonics, Ferroelectrics, and Frequency Control, Dec. 2004, pp. 1607-1628, vol. 51, No. 12.

* cited by examiner

*Primary Examiner*—Charles D Garber
*Assistant Examiner*—Calvin Choi
(74) *Attorney, Agent, or Firm*—O'Keefe, Egan, Peterman & Enders LLP

(57) ABSTRACT

A method to form a MEMS structure is described. In an embodiment, a structure having a first release layer between a substrate and a member is provided. A second release layer is adjacent to a sidewall of the member. At least a portion of each of the first and the second release layers is then removed. In one embodiment, the member is formed by a damascene process. In another embodiment, the member is formed by a subtractive process. In a specific embodiment, the second release layer formed adjacent to a sidewall of the member has sub-lithographic dimensions.

21 Claims, 12 Drawing Sheets

METHOD TO FORM A MEMS STRUCTURE HAVING A SUSPENDED PORTION

BACKGROUND OF THE INVENTION

1) Field of the Invention

The invention is in the field of Microelectromechanical Systems (MEMS).

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

A recent fabrication challenge in the field MEMS devices is the formation of MEMS resonators. A typical MEMS resonator has at least a portion of the MEMS structure "suspended" above a substrate, i.e. not directly attached to the substrate, thus requiring the incorporation of a release layer at some point in the fabrication process. A damascene approach utilizing a sacrificial damascene layer has been employed to fabricate such resonators. This method, however, has its limitations.

A damascene approach incorporating a sacrificial damascene layer as a release layer has been used to fabricate a MEMS resonator. FIGS. 1A-C illustrate cross-sectional views representing a series of steps in a damascene approach for fabricating a MEMS structure having a member suspended above a substrate, in accordance with the prior art. Referring to FIG. 1A, a trench 106 consisting of a first feature 108 and a second feature 110, usually patterned in two separate steps, is patterned into release layer 104 above a substrate 102. Trench 106 is then filled with a structural layer 112, usually by blanket deposition of a material layer followed by planarization of the material layer, as depicted in FIG. 1B. Referring to FIG. 1C, release layer 104 is removed to provide a MEMS resonator 114 comprised of a resonating member 116 (formed from second feature 110 of trench 106) connected to substrate 102 by an anchor 118 (formed from first feature 108 of trench 106). One drawback to this approach is that the second feature 110 is patterned into release layer 104 by a timed etch process in order to partially etch release layer 104. Thus, variability in the etch process used will lead to variability of the dimensions of the MEMS resonator 114.

A damascene approach incorporating a sacrificial damascene layer as a release layer has also been used to fabricate a MEMS resonator flanked by a pair of electrodes. FIGS. 2A-D illustrate cross-sectional views representing a series of steps in a damascene approach for fabricating a MEMS structure having a member suspended above a substrate and between a pair of electrodes, in accordance with the prior art. Referring to FIG. 2A, a mask 220 comprised of blade portions 222 is formed above a release layer 204, which is above a substrate 202. Trenches 206 consisting of first features 208 and second features 210, usually patterned in two separate steps, are patterned into release layer 204, as depicted in FIG. 2B. Referring to FIG. 2C, trenches 206 are then filled with a structural layer 212, usually by blanket deposition of a material layer followed by planarization of the material layer. Release layer 204 is then removed to provide a MEMS resonator 214 comprised of a resonating member 216 and flanked by a pair of electrodes 224, all of which are connected to substrate 202 by anchors 218 (formed from first features 208 of trenches 206), as depicted in FIG. 2D. One drawback to this approach is that blade portions 222 from mask 220 are used to ultimately define the spacing between a resonating member 216 and a pair of electrodes 224. Thus, the spacing is confined to lithographic constraints and the surface roughness of the sidewalls of the resonating member 216 and pair of electrodes 224 is dictated by the etch process used to pattern release layer 204. Both factors may hinder the quality and/or applicability of the MEMS resonator.

Thus, a method to form a MEMS structure having a member suspended above a substrate is described herein.

DETAILED DESCRIPTION

Figure 1A:
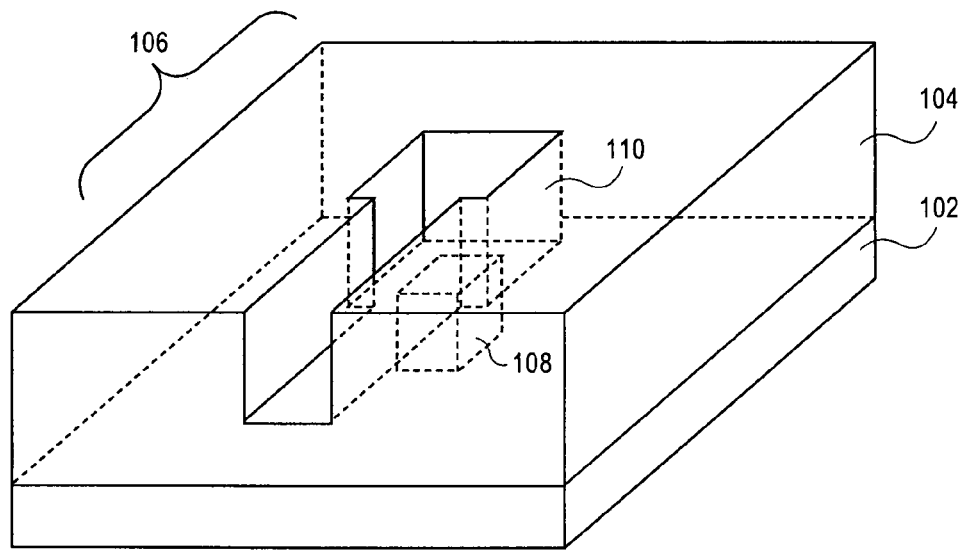
FIGS. 1A-C illustrate cross-sectional views representing a series of steps in a damascene approach for fabricating a MEMS structure having a member suspended above a substrate, in accordance with the prior art.
Figure 1B:
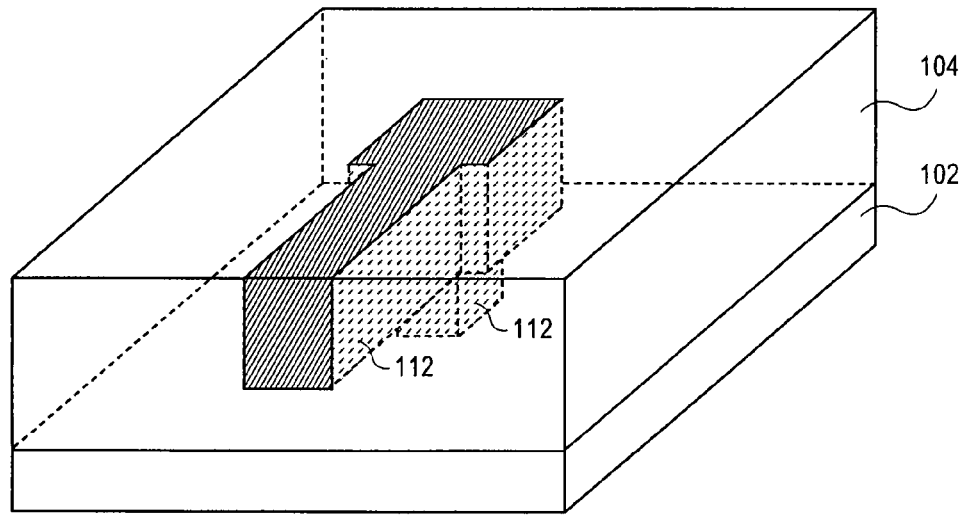
Figure 1C:
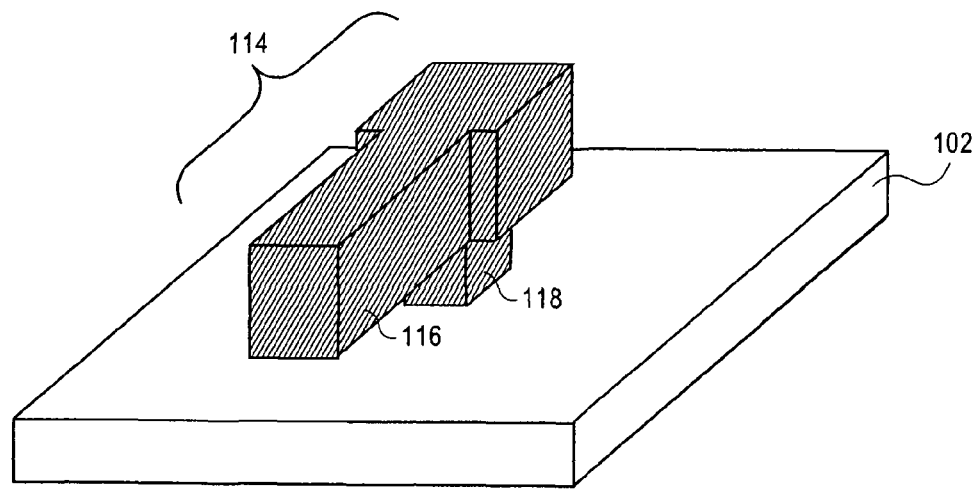
Figure 2A:
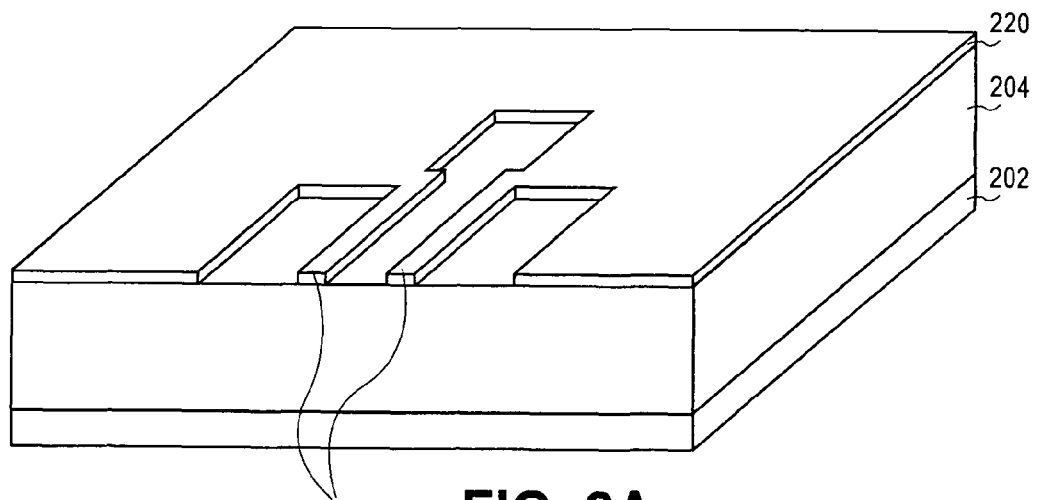
FIGS. 2A-D illustrate a cross-sectional view representing a series of steps in a damascene approach for fabricating a MEMS structure having a member suspended above a substrate and between a pair of electrodes, in accordance with the prior art.
Figure 2B:
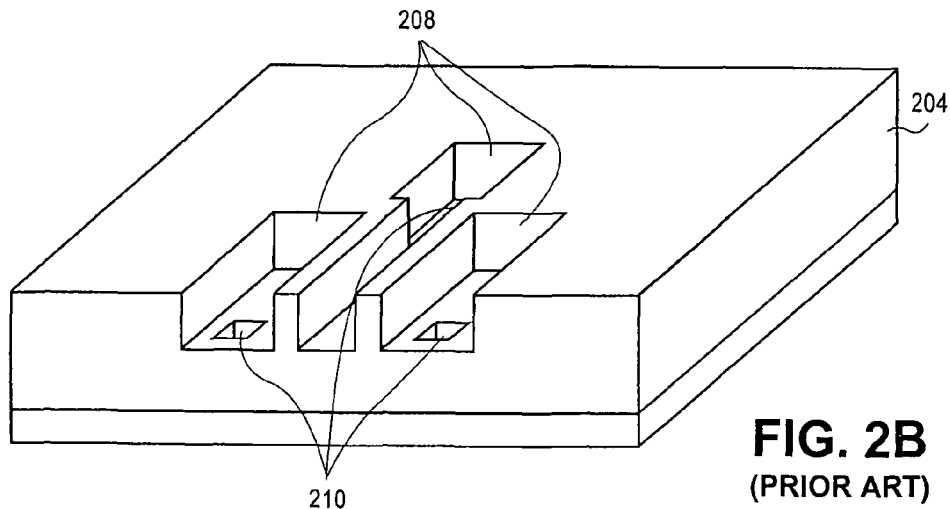
Figure 2C:
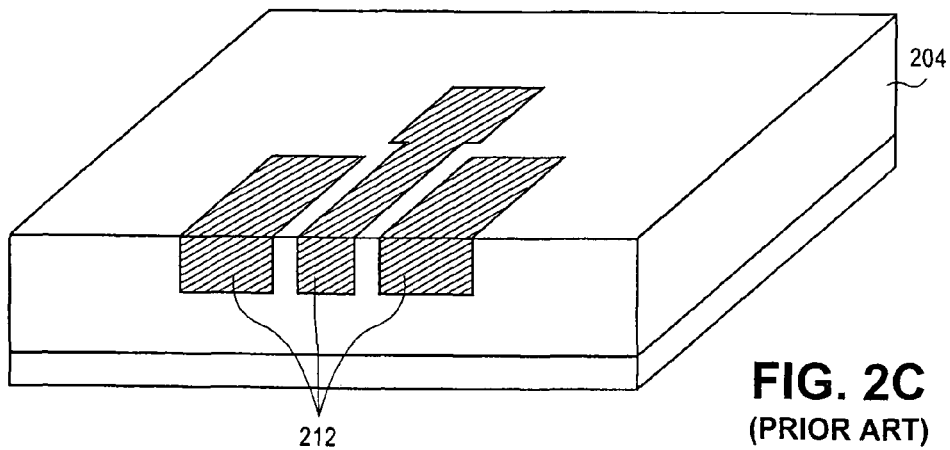
Figure 2D:
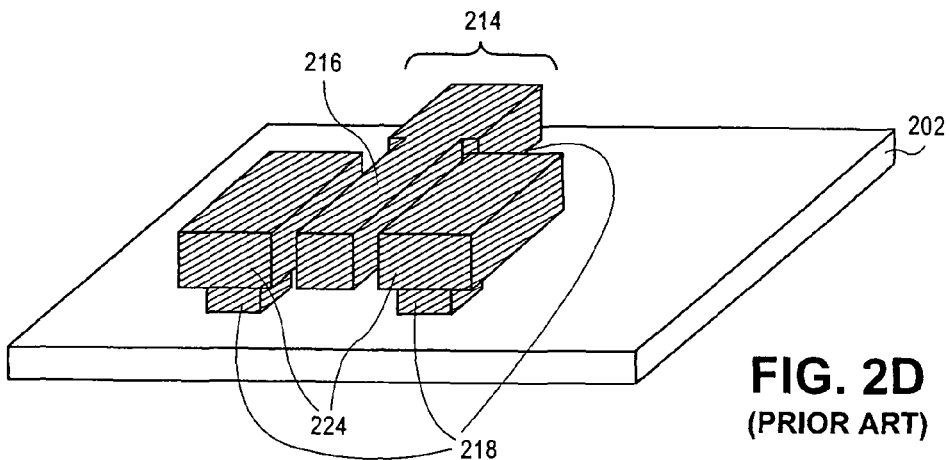

A method to form a MEMS structure having a member suspended above a substrate is described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the figures are illustrative representations and are not necessarily drawn to scale.

Disclosed herein is a method to form a MEMS structure having a member suspended above a substrate. A structure having a first release layer between a substrate and a member may be provided. In an embodiment, a second release layer is adjacent to a sidewall of the member. In a specific embodiment, the second release layer has sub-lithographic dimensions. At least a portion of each of the first and the second release layers is then removed. In one embodiment, the member is formed by a damascene process. In another embodiment, the member is formed by a subtractive process.

A MEMS structure may be formed by a damascene approach using more than one release layer. For example, in accordance with an embodiment of the present invention, a stack is provided having a first release layer above a second release layer, which sits above a substrate. The first release layer is used as a damascene layer to form a first trench while the underlying second release layer acts as an etch stop for patterning the first release layer. A second trench is formed in the second release layer and below the first trench to expose a portion of the underlying substrate. A structural layer is then formed in both trenches. At least a portion of each of the first and second release layers is removed to provide a MEMS structure having a member suspended above the substrate. In one embodiment, by using the second release layer as an etch stop, effects on dimensions of the member due to variability in the etch process used to pattern the first release layer are negligible. A MEMS structure may also be formed by a subtractive approach using more than one release layer. For example, in accordance with an embodiment of the present invention, a stack is provided having a first structural layer above a first release layer, which sits above a substrate. The first structural layer is patterned to form a member. A second release layer is provided adjacent to the sidewalls of the member and a second structural layer is then provided adjacent to the second release layer. At least a portion of each of the first and second release layers is then removed to provide a MEMS structure having a member suspended above the substrate and spaced apart from a second structural layer. In one embodiment, by using a second release layer in between a member and a second structural layer, the spacing between the member and the second structural layer is not confined to lithographic constraints. In another embodiment, the surface roughness of the sidewalls of the member and the structural layer is negligible.

A MEMS structure may be formed by a damascene approach using two or more release layers. FIGS. 3A-E illustrate cross-sectional views representing a series of steps in a damascene approach using two release layers to fabricate a MEMS structure having a member suspended above a substrate, in accordance with an embodiment of the present invention.

Figure 3A:
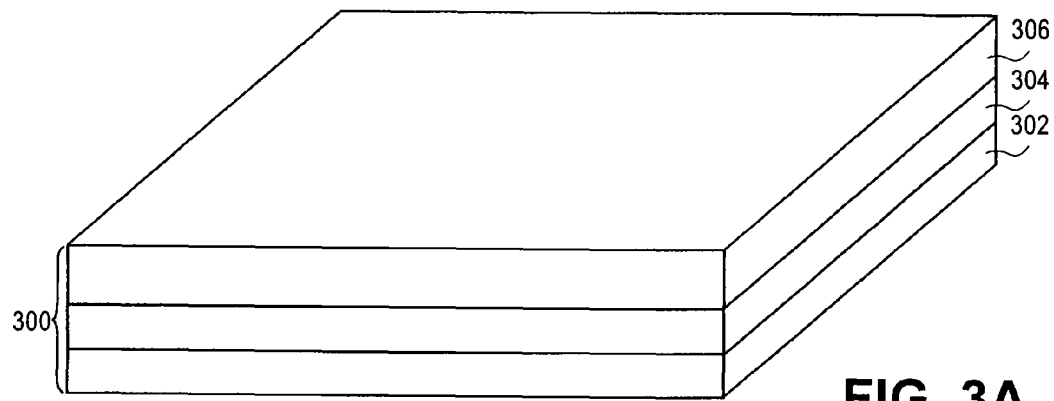
FIGS. 3A-E illustrate cross-sectional views representing a series of steps in a damascene approach using two release layers to fabricate a MEMS structure having a member suspended above a substrate, in accordance with an embodiment of the present invention.

Referring to FIG. 3A, a stacked structure 300 is provided comprising a substrate 302 having a first release layer 306 above a second release layer 304.

Substrate 302 may be comprised of any material suitable to withstand a MEMS fabrication process and to provide structural integrity for a MEMS structure having a suspended member. In an embodiment, substrate 302 is comprised of group IV-based materials such as crystalline silicon, germanium or silicon/germanium. In another embodiment, substrate 302 is comprised of a III-V material. Substrate 302 may also comprise an insulating layer. In one embodiment, the insulating layer is comprised of a material selected from the group consisting of silicon dioxide, silicon nitride, silicon oxy-nitride and a high-k dielectric layer. Substrate 302 may be an insulator. In one embodiment, substrate 302 consists of glass, quartz or sapphire. Substrate 302 may comprise a fabricated integrated circuit. For example, in accordance with an embodiment of the present invention, substrate 302 comprises an insulator layer above a plurality of interconnect structures connecting a plurality of micro-electronic devices, wherein first release layer 306 and second release layer 304 are above the insulator layer. In one embodiment, the plurality of micro-electronic devices is a plurality of N-type and P-type transistors and the plurality of interconnect structures is a plurality of metal interconnects that tie the plurality of N-type and P-type transistors into an integrated circuit. Substrate 302 may further comprise conductive electrodes that contact underlying interconnect structures. For example, in one embodiment, substrate 302 comprises an electrical contact comprised of a conductive plug or via.

First release layer 306 may be comprised of any material suitable to withstand a MEMS fabrication process and to be patterned selective to second release layer 304. For example, in accordance with an embodiment of the present invention, first release layer 306 is comprised of a material selected from the group consisting of an insulator and a semiconductor. In one embodiment, first release layer 306 is an insulating material and is comprised of a material selected from the group consisting of silicon dioxide, silicon nitride, silicon oxy-nitride and a high-K dielectric material. In one embodiment, first release layer 306 is a semiconducting material and is selected from the group consisting of silicon, germanium, silicon/germanium, carbon-doped silicon and a III-V material. The semiconducting material may also be comprised of dopant impurity atoms. For example, in one embodiment, the semiconducting material is germanium and the concentration of dopant impurity atoms is selected to optimize the germanium nucleation at a temperature in the range of 300-400° C. In a specific embodiment, first release layer 306 is comprised of greater than 98% germanium atoms along with boron dopant impurity atoms having a total atomic concentration in the range of $5 \times 10^{19}$-$5 \times 10^{20}$ atoms/cm$^3$. First release layer 306 may be comprised of any material that may be removed with high selectivity to a subsequently formed structural layer. For example, in accordance with an embodiment of the present invention, a subsequently formed structural layer is comprised of silicon/germanium and first release layer 306 substantially comprises germanium. In a specific embodiment, both the silicon/germanium structural layer and the germanium release layer are doped with boron dopant impurity atoms. In another embodiment, a subsequently formed structural layer is comprised of silicon/germanium and first release layer 306 substantially comprises silicon deposited by a low-temperature physical vapor deposition process.

Second release layer 304 may be comprised of any material suitable to withstand a MEMS fabrication process and to act as an etch stop layer during the patterning of first release layer 306. Second release layer 304 may be comprised of any material described in association with first release layer 306. However, in accordance with an embodiment of the present invention, second release layer 304 is comprised of a different material than first release layer 306. Thus, first release layer 306 and second release layer 304 may be a pairing wherein the etch characteristics of the two release layers are different. For example, in one embodiment, first release layer 306 is a group IV semiconductor material and second release layer 304 is an insulator layer. In another embodiment, first release layer 306 is an insulator layer and second release layer 304 is a group IV semiconductor material. In one embodiment, first release layer 306 is substantially comprised of silicon and second release layer 304 is substantially comprised of germanium. In another embodiment, first release layer 306 is substantially comprised of germanium and second release layer 304 is substantially comprised of silicon. Alternatively, first release layer 306 and second release layer 304 may be a pairing wherein the difference is only in the concentration of dopant impurity atoms in each film. In one embodiment, both first release layer 306 and second release layer 304 are comprised of germanium having boron dopant impurity atoms. In a specific embodiment, both first release layer 306 and second release layer 304 are comprised of greater than 98% germanium atoms and the difference in concentration of boron dopant impurity atoms between the two layers is at least $1 \times 10^{19}$ atoms/cm$^3$.

Release layers 304 and 306 may be formed on substrate 302 by any suitable deposition process that generates uniform material layers of consistent composition. For example, in accordance with an embodiment of the present invention, release layers 304 and 306 are deposited by a process selected from the group consisting of chemical vapor deposition, physical vapor deposition and atomic layer deposition. Release layers 304 and 306 may be deposited by a low temperature deposition process. In a specific embodiment, substrate 302 is comprised of an insulator layer above an integrated circuit and release layers 304 and 306 are deposited by low-pressure chemical vapor deposition processes at temperatures less than 450° C. The thickness of first release layer 306 may be any thickness suitable to provide a MEMS structure having a suspended feature with a desired dimension. For example, in accordance with an embodiment of the present invention, the thickness of first release layer 306 determines the thickness of a MEMS member formed by a damascene process. In one embodiment, the thickness of first release layer 306 is in the range of 0.1-10 microns. The thickness of second release layer 304 may be any thickness suitable to provide a suspension height necessary for a desired MEMS application. For example, in accordance with an embodiment of the present invention, the thickness of second release layer 304 determines the height at which a MEMS member is suspended above a substrate. In one embodiment, the thickness of second release layer 304 is in the range of 0.1-5 microns.

Figure 3B:
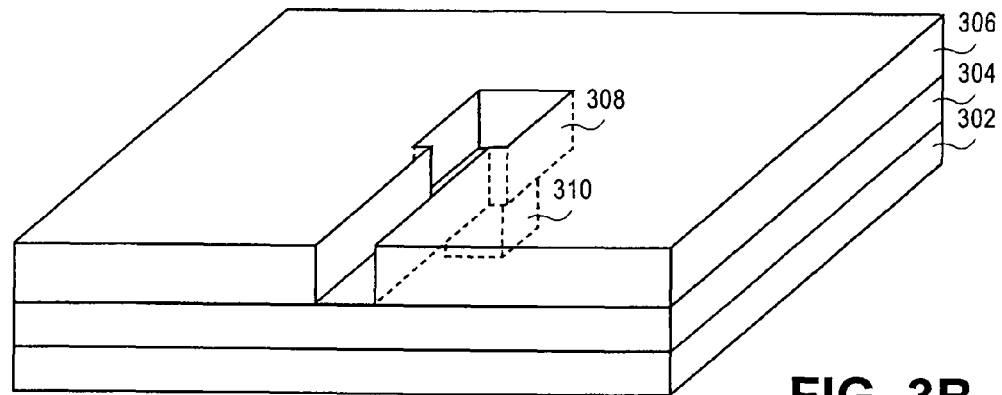

Referring to FIG. 3B, trenches 308 and 310 are formed in first release layer 306 and second release layer 304, respectively. In accordance with an embodiment of the present invention, second release layer 304 acts as an etch stop during the patterning of first release layer 306 to form trench 308. First release layer 306 may be patterned by any lithographic/etch process suitable to provide an appropriately sized trench 308 and suitable to not etch a significant portion of second release layer 304. For example, in accordance with an embodiment of the present invention, first release layer 306 is patterned by first patterning a positive photo-resist layer above first release layer 306 by exposure to a wavelength of light selected from the group consisting of 248 nm, 193 nm and 157 nm. In another embodiment, an e-beam direct-write process is used to pattern the positive photo-resist layer. An etch process may then be used to pattern first release layer 306 with selectivity to second release layer 304. In one embodiment, a dry etch process is used to etch first release layer 306 with a selectivity to second release layer 304 of at least 10:1. In a particular embodiment, first release layer 306 is comprised substantially of germanium, second release layer 304 is comprised of an insulator layer, and the dry etch process comprises an anisotropic plasma etch process wherein the plasma is generated from gases selected from the group consisting of $SF_6$ and the combination of HBr, $Cl_2$ and $O_2$. In another particular embodiment, first release layer 306 is comprised substantially of an insulator layer, second release layer 304 is comprised of a semiconductor material, and the dry etch process comprises an anisotropic plasma etch process wherein the plasma is generated from gases selected from the group consisting of $CF_4$ and $CHF_3$. In one embodiment, although not depicted, a hard-mask layer is utilized in between the positive photo-resist and first release layer 306. Trench 310 may then be patterned in second release layer 304, as also depicted in FIG. 3B. In accordance with an embodiment of the present invention, trench 310 is formed by any lithography/etch process described in association with the formation of trench 308, specific to the material of second release layer 304.

Figure 3C:
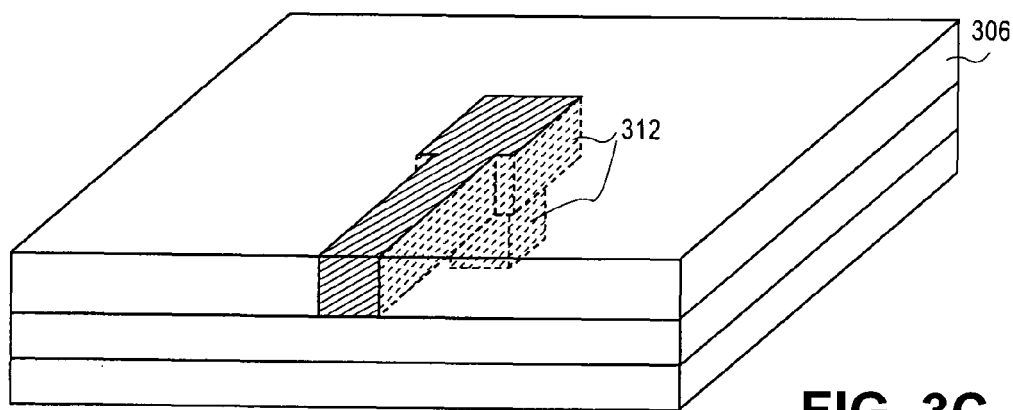

Referring to FIG. 3C, trenches 308 and 310 are filled with a structural layer 312. Structural layer 312 may be formed from any material suitable to withstand a MEMS fabrication process and to satisfy the required characteristics of a MEMS structure having a suspended member. For example, in accordance with an embodiment of the present invention, structural layer 312 is comprised of a material selected from the group consisting of an insulator, a semiconductor and a conductor. In one embodiment, structural layer 312 is an insulating material and is comprised of a material selected from the group consisting of silicon dioxide, silicon nitride, silicon oxy-nitride and a high-K dielectric material. In one embodiment, structural layer 312 is a semiconducting material and is selected from the group consisting of silicon, germanium, silicon/germanium, carbon-doped silicon, carbon-doped silicon/germanium and a III-V material. The semiconducting material may also be comprised of dopant impurity atoms. For example, in a specific embodiment, structural layer 312 is comprised of polycrystalline silicon/germanium with a germanium atomic concentration in the range of 50-70% and boron dopant impurity atoms with a total atomic concentration in the range of $1 \times 10^{18}$-$5 \times 10^{20}$ atoms/cm$^3$. In one embodiment, structural layer 312 is comprised of a conductor and is formed from a material selected from the group consisting of copper, aluminum, a metal alloy and a metal silicide. Structural layer 312 may be deposited by any technique suitable to substantially fill trenches 308 and 310. In accordance with an embodiment of the present invention, structural layer 312 is deposited by a process selected from the group consisting of chemical vapor deposition, physical vapor deposition, atomic layer deposition, electroplating and electro-less plating deposition. In one embodiment, structural layer 312 is formed by first blanket depositing a material layer above first release layer 306 and in trenches 308 and 310 and, subsequently, planarizing the material layer to expose the top surface of first release layer 306, as depicted in FIG. 3C. Structural layer 312 may be comprised of a material that is formed by a low temperature process. Thus, in accordance with another embodiment of the present invention, structural layer 312 is comprised of a material formed at a temperature less than approximately 450° C.

Figure 3D:
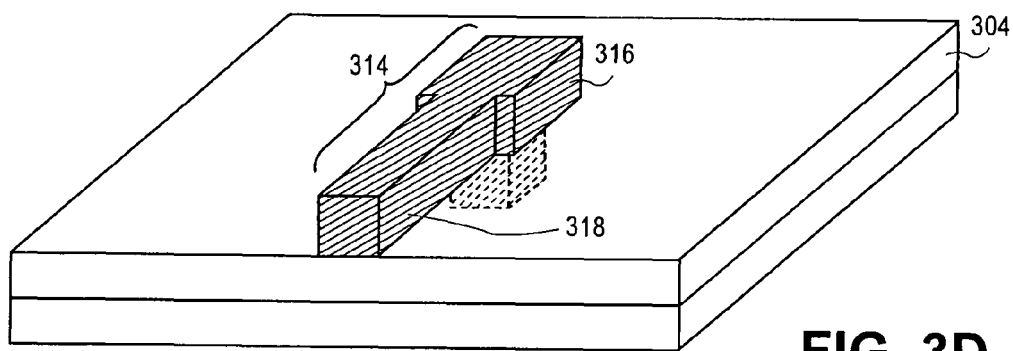

Referring to FIG. 3D, first release layer 306 is removed to provide member 314 comprised of base 316 and extended portion 318. First release layer 306 may be removed by any technique that enables removal without significantly impacting member 314. For example, in accordance with an embodiment of the present invention, member 314 comprises silicon/germanium and first release layer 306 substantially comprises germanium and is removed by an oxidizing etchant. In a specific embodiment, first release layer 306 is comprised of germanium with an atomic concentration of greater than 98% germanium atoms and a wet etchant comprising an aqueous solution of $H_2O_2$ with a concentration in the range of 25-35% by volume and a temperature in the range of 80-95° C. is used to remove first release layer 306. In a particular embodiment, first release layer 306 is further comprised of boron dopant impurity atoms with a concentration in the range of $5 \times 10^{19}$-$5 \times 10^{20}$ atoms/cm$^3$. In accordance with another embodiment of the present invention, member 314 comprises silicon/germanium and first release layer 306 substantially comprises silicon and is removed by a high pH etchant. In a specific embodiment, first release layer 306 is comprised of silicon with an atomic concentration of greater than 99% silicon atoms and a wet etchant comprising an aqueous solution of NH$_4$OH with a concentration in the range of 1-20% by volume and a temperature in the range of 15-40° C. is used to remove first release layer 306. In a particular embodiment, first release layer 306 is further comprised of phosphorus and/or arsenic dopant impurity atoms with a concentration in the range of $5\times10^{18}$-$1\times10^{20}$ atoms/cm$^3$. In accordance with another embodiment of the present invention, member 314 comprises silicon/germanium and first release layer 306 comprises an insulator material and is removed by a low pH etchant. In a specific embodiment, first release layer 306 is comprised of silicon nitride and is removed by a solution of heated phosphoric acid. In another specific embodiment, first release layer is comprised of an oxide of silicon and is removed by a solution of hydrofluoric acid. In an embodiment, first release layer 306 is removed with a selectivity greater than 20:1 over member 314. Second release layer may also be removed during the removal of first release layer 306. However, in accordance with an embodiment of the present invention, the etch characteristics for first release layer 306 and second release layer 304 are different and, thus, first release layer 306 is removed selective to second release layer 304, as depicted in FIG. 3D.

Figure 3E:
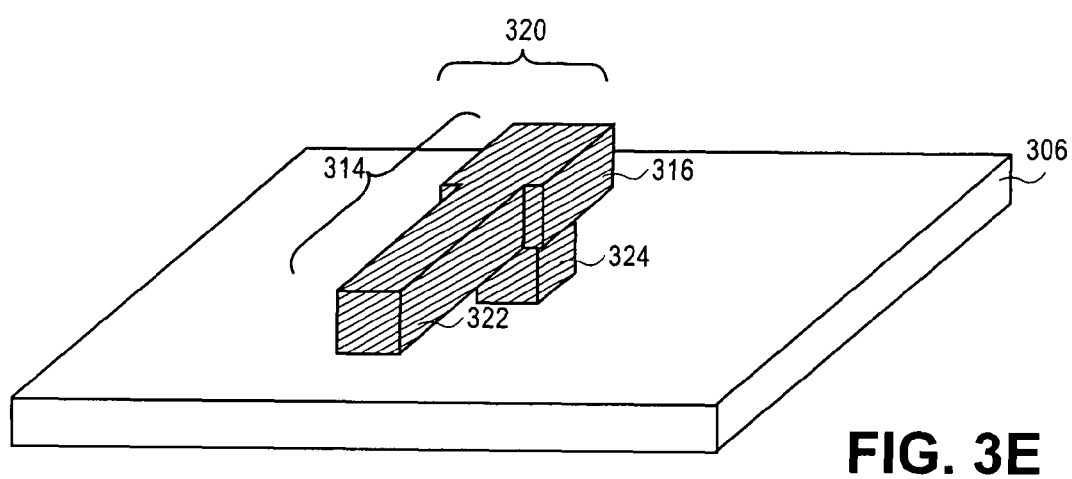

Referring to FIG. 3E, first release layer 306 is removed to provide MEMS structure 320 comprised of member 314 having base portion 316 and a suspended portion 322. Member 314 is coupled with substrate 302 by coupler 324. Second release layer 304 may be removed by any technique that enables removal without significantly impacting MEMS structure 320 or substrate 302. In accordance with an embodiment of the present invention, second release layer 304 is removed by any technique described in association with the removal of first release layer 306, specific to the material of second release layer 304. In an embodiment, second release layer 304 is removed with a selectivity greater than 20:1 over MEMS structure 320 and a selectivity greater than 15:1 over substrate 302.

MEMS structure 320 may be any device that falls within the scope of MEMS technologies. For example, MEMS structure 320 may be any mechanical and electronic structure having a critical dimension of less than approximately 250 microns and fabricated using lithography, deposition, and etching processes above a substrate. In accordance with an embodiment of the present invention, MEMS structure 320 is a device selected from the group consisting of a resonator, a sensor, a detector and a mirror. In one embodiment, MEMS structure 320 is a resonator and member 314 is a resonating member. Thus, the suspended portion 322 of member 314 may be any suspended feature having a resonant frequency. For example, in an embodiment, suspended portion 322 is a feature selected from the group consisting of a beam, a plate and a tuning fork. In a specific embodiment, suspended portion 322 is a cantilever arm, as depicted in FIG. 3E. Member 314 may have any dimensions suitable for a desired MEMS function. For example, in accordance with an embodiment of the present invention, MEMS structure 320 is a resonator comprised of a cantilever arm 322. The length of member 314 is in the range of 1-250 microns and the length of cantilever arm 322 comprises a portion of the length of member 314 in the range of 50-90%. The height of member 314 is in the range of 0.1-10 microns and the width at portion 322 is in the range of 0.1-100 microns. In one embodiment, the length of member 314 is in the range of 70-90 microns, the height of member 314 is in the range of 0.5-5 microns and the width at portion 322 is in the range of 0.5-5 microns. In a specific embodiment, cantilever arm 322 is suspended at a distance in the range of 0.1-0.5 microns above substrate 302.

A MEMS structure may be formed by a subtractive approach using two or more release layers. FIGS. 4A-J illustrate cross-sectional views representing a series of steps in a subtractive approach using two release layers to fabricate a MEMS structure having a member suspended above a substrate and between a pair of electrodes, in accordance with an embodiment of the present invention.

Figure 4A:
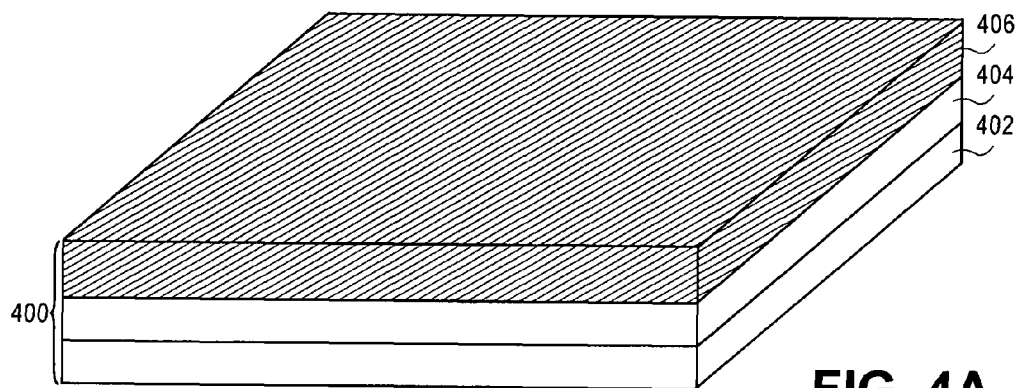
FIGS. 4A-J illustrate cross-sectional views representing a series of steps in a subtractive approach using two release layers to fabricate a MEMS structure having a member suspended above a substrate and between a pair of electrodes, in accordance with an embodiment of the present invention.

Referring to FIG. 4A, a stacked structure 400 is provided comprising a substrate 402 having a first structural layer 406 above a first release layer 404. Substrate 402, first release layer 404 and first structural layer 406 may be comprised of any material described in association with substrate 302, structural layer 312 and second release layer 304, respectively, from FIGS. 3A and 3C. The thickness of first structural layer 406 may be any thickness described in association with the thickness of first release layer 306 and, hence, member 314 from FIGS. 3A and 3E. The thickness of first release layer 404 may be any thickness described in association with the distance that member 314 is suspended above substrate 302, also described in association with FIG. 3E.

Figure 4B:
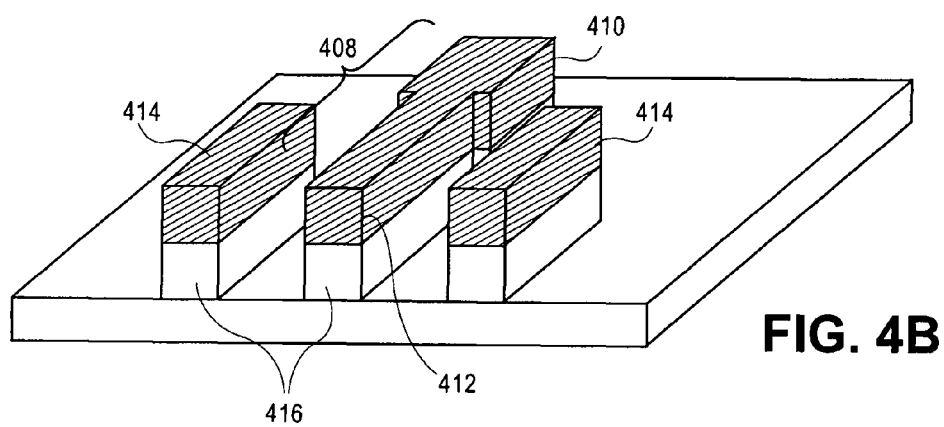

Referring to FIG. 4B, first structural layer 406 and first release layer 404 are patterned to form pre-coupled member 408 (comprised of a pre-base portion 410 and a pre-suspension portion 412) and pre-coupled electrodes 414 above patterned first release layer 416. The width and length of pre-suspension portion 412 may be any width and length described in association with suspended portion 322 from FIG. 3E. First structural layer 406 and first release layer 404 may be patterned by any lithographic/etch process suitable to provide the appropriate dimensions required for pre-coupled member 408 and pre-coupled electrodes 414. For example, in accordance with an embodiment of the present invention, first structural layer 406 and first release layer 404 are patterned by first patterning a positive photo-resist layer above first structural layer 406 by exposure to a wavelength of light selected from the group consisting of 248 nm, 193 nm and 157 nm. In another embodiment, an e-beam direct-write process is used to pattern the positive photo-resist layer. An etch process may then be used to pattern first structural layer 406 and first release layer 404. In one embodiment, a dry etch process is used. In a particular embodiment, first structural layer 406 is comprised of silicon/germanium, first release layer is comprised substantially of germanium, and the dry etch process comprises an anisotropic plasma etch process wherein the plasma is generated from gases selected from the group consisting of SF$_6$, CF$_4$ and the combination of HBr, Cl$_2$ and O$_2$. In one embodiment, a hard-mask layer is utilized in between the positive photo-resist and first structural layer 406.

Figure 4C:
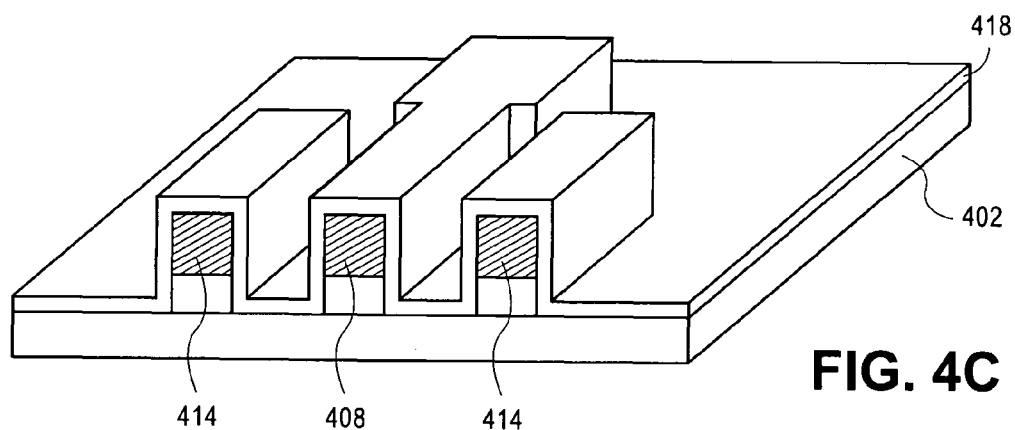

Referring to FIG. 4C, a second release layer 418 is deposited conformally over pre-coupled member 408 and pre-coupled electrodes 414 and above substrate 402. Second release layer 418 may be formed from any material and deposited by any technique used to form first release layer 306 and/or second release layer 404, described in association with FIGS. 3A and 4A. Second release layer 418 need not be comprised of the same material as first release layer 404. In one embodiment, second release layer 418 is comprised of a different material than first release layer 404. However, in an alternative embodiment, second release layer 418 is comprised of the same material as first release layer 404. The thickness of second release layer 418 may be any thickness that determines the spacing between pre-suspension portion 412 of pre-coupled member 408 and a subsequently deposited second structural layer. In one embodiment, the thickness of second release layer 418 is in the range of 100-500 nanometers.

Figure 4D:
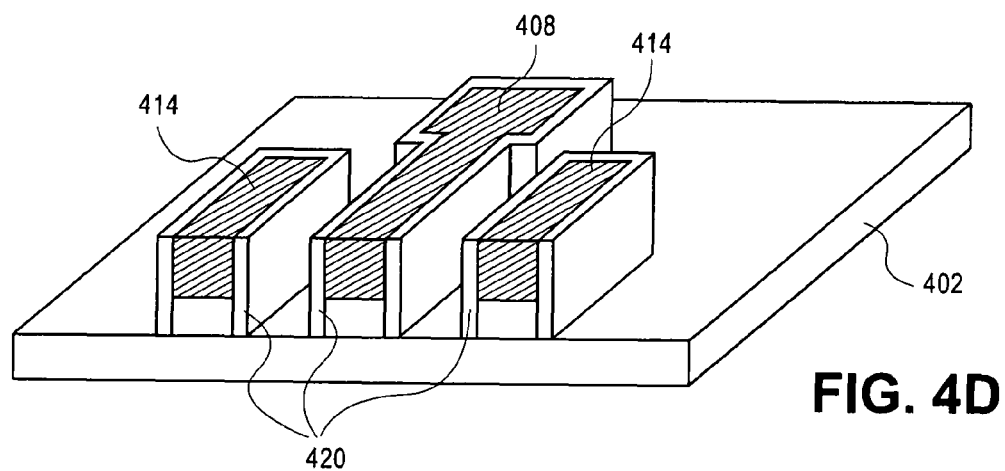

Referring to FIG. 4D, second release layer 418 is anisotropically patterned to provide patterned second release layer 420 and to expose substrate 402 and the top surfaces of pre-coupled member 408 and pre-coupled electrodes 414. Second release layer 418 may be etched using any dry etch process described in association with the etching of first structural layer 406 and first release layer 404 from FIG. 4B. Thus, in accordance with an embodiment of the present invention, second release layer 418 is converted to a spacer-like release layer which enables the subsequent formation of a spacing between pre-coupled member 408 and second structural layer 426 (described in association with FIG. 4G below) that is not confined to lithographic constraints.

Figure 4E:
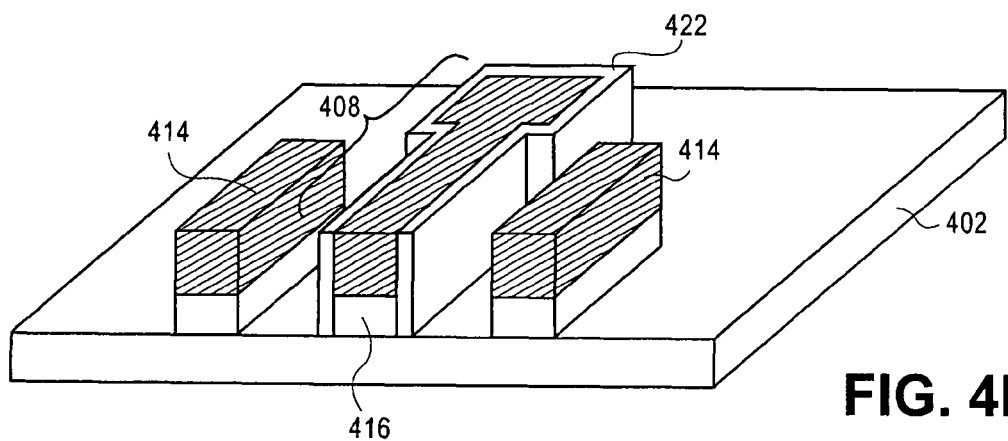

Referring to FIG. 4E, patterned second release layer 420 is removed from pre-coupled electrodes 414 to form lateral release layer 422 adjacent to the sidewalls of pre-coupled member 408 and the underlying portion of patterned first release layer 416. Patterned second release layer may be removed from pre-coupled electrodes 414 by any suitable process that leaves a substantial portion adjacent to the sidewalls of pre-coupled member 408. For example, in accordance with an embodiment of the present invention, patterned second release layer is removed from pre-coupled electrodes 414 by masking pre-coupled member 408 with a photo-resist layer or a hard-mask layer and subsequently etching the portions adjacent to pre-coupled electrodes 414 by a dry etch process. In one embodiment, the same dry etch process originally used to pattern second release layer 418 is used to remove the portions of patterned second release layer 418 adjacent to pre-coupled electrodes 414.

Figure 4F:
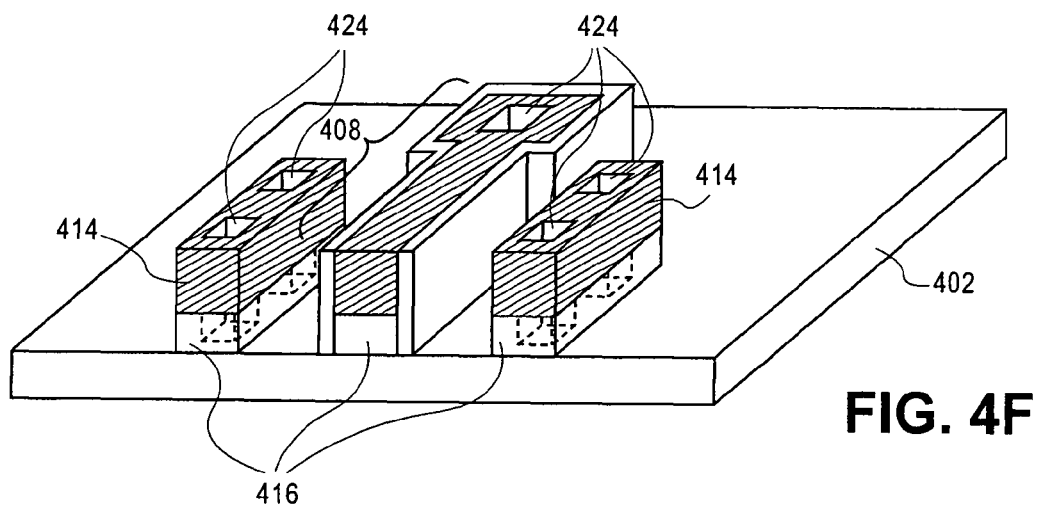

Referring to FIG. 4F, pre-coupled member 408 and pre-coupled electrodes 414 are patterned to form pre-coupler holes 424, which extend through patterned first release layer 416 and land on substrate 402. Pre-coupled member 408 and pre-coupled electrodes 414 may be patterned by any lithographic/etch process used to pattern first structural layer 406, described in association with FIG. 4B. It is to be understood that the precise sequence of patterning steps used to remove second release layer 420 from pre-coupled electrodes 414 and to form pre-coupler holes 424 may vary. For example, in accordance with another embodiment of the present invention, pre-coupler holes 424 are formed prior to removing second release layer 420 from pre-coupled electrodes 414. In a specific embodiment, a hard-mask is initially formed above first structural layer 406 and is carried through all of the patterning steps described in association with FIGS. 4B-4F. It should be noted that the present invention is not limited to forming couplers and, hence, pre-coupler holes 424 subsequent to the formation of pre-coupled member 408 and pre-coupled electrodes 414. In accordance with an alternative embodiment of the present invention, couplers are formed in first release layer 404 prior to the deposition of first structural layer 406.

Figure 4G:
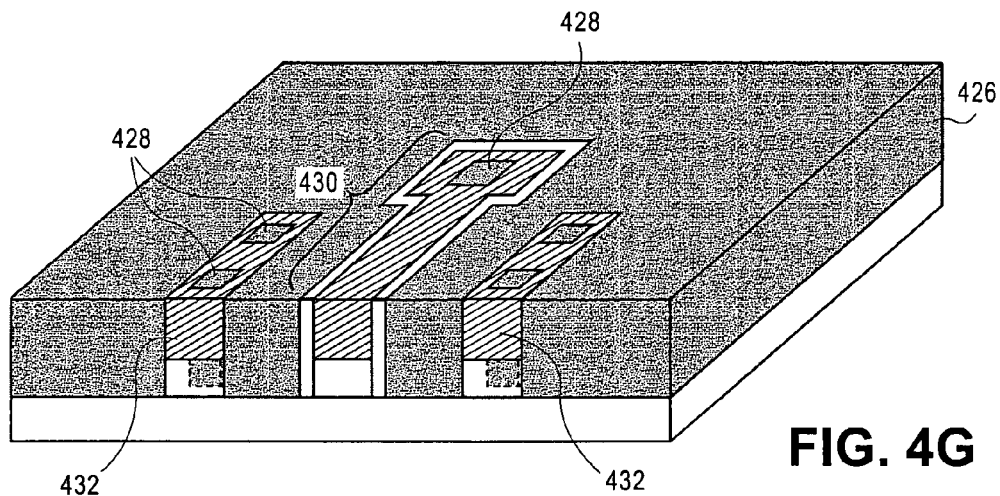

Referring to FIG. 4G, a second structural layer 426 is deposited adjacent to pre-coupled member 408 and pre-coupled electrodes 414 and in pre-coupler holes 424 in order to form couplers 428. Accordingly, coupled member 430 and coupled electrodes 432 are generated. Second structural layer 426 may be deposited by any suitable technique that enables the formation of couplers 428 without leaving material in undesirable locations. For example, in accordance with an embodiment of the present invention, the material used to form second structural layer 426 is blanket deposited above pre-coupled member 408 and pre-coupled electrodes 414 and then polished back to expose the top surface of pre-coupled member 408 and pre-coupled electrodes 414, as depicted in FIG. 4G. Second structural layer 426 may be comprised of any material described in association with first structural layer 406 from FIG. 4A. Alternatively, second structural layer 426 may be comprised of a highly conductive material. For example, in accordance with an embodiment of the present invention, second structural layer 426 is comprised of a material selected from the group consisting of a semiconductor material heavily doped with charge-carrier impurity atoms and a conductor. In one embodiment, second structural layer 426 is a heavily doped semiconducting material and is selected from the group consisting of silicon, germanium, silicon/germanium, carbon-doped silicon and a III-V material. In a specific embodiment, second structural layer 426 is comprised of a group IV material and is heavily doped with charge-carrier impurity atoms selected from the group consisting of boron, indium, phosphorus, arsenic and antimony. For example, in a particular embodiment, second structural layer 426 is comprised of polycrystalline silicon/germanium with a germanium atomic concentration in the range of 55-95% and boron dopant impurity atoms with a total atomic concentration in the range of $1 \times 10^{20}$-$5 \times 10^{22}$ atoms/cm$^3$. In another specific embodiment, second structural layer 426 is comprised of a group III-V material and is heavily doped with charge-carrier impurity atoms selected from the group consisting of carbon, silicon, germanium, oxygen, sulfur, selenium and tellurium. In one embodiment, second structural layer 426 is comprised of a conductor and is formed from a material selected from the group consisting of copper, aluminum, a metal alloy and a metal silicide. A low temperature process may be used to form second structural layer 426. Thus, in accordance with another embodiment of the present invention, second structural layer 426 is comprised of a material formed at a temperature less than approximately 450° C.

Figure 4H:
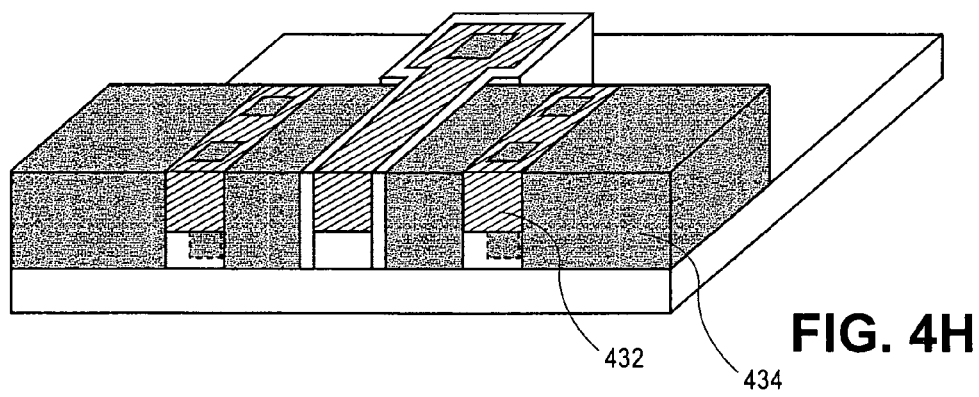

Additionally, second structural layer 426 may be comprised of a material having a low resistivity. For example, in one embodiment, second structural layer 426 is comprised of a material having a volume resistivity less than $1 \times 10^{-5}$ ohms·cm. In comparison with first structural layer 406, second structural layer 426 may be relatively more conductive than first structural layer 406. In an embodiment, second structural layer 426 is at least twice as conductive as first structural layer 406. In an alternative embodiment, second structural layer 426 is comprised of substantially the same material as first structural layer 406. In accordance with an embodiment of the present invention, second structural layer 426 is for electrically coupling pre-coupled electrodes 414 with substrate 302 and for anchoring pre-coupled member 408 to substrate 302. Second structural layer 426 may then be patterned to form electrode extensions 434 on coupled electrodes 432, as depicted in FIG. 4H.

Figure 4I:
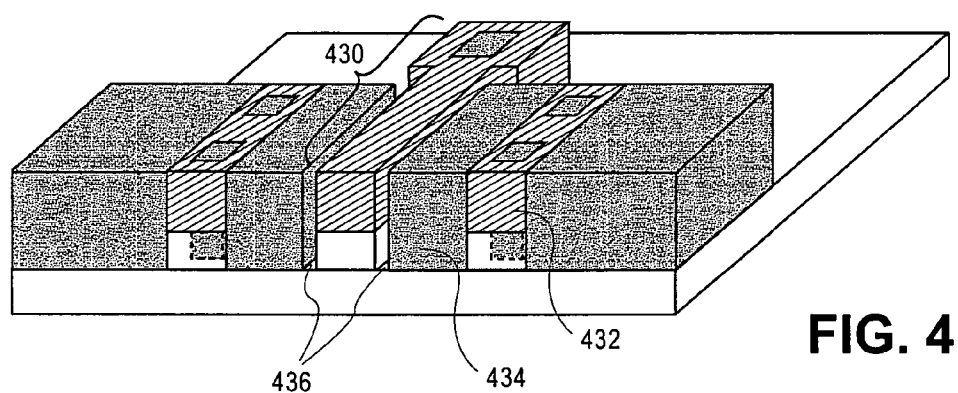

Referring to FIG. 4I, lateral release layer 422 is removed to form spacings 436 between coupled member 430 and electrode extensions 434 of coupled electrodes 432. Lateral release layer 422 may be removed by any process used to remove first and second release layers 306 and 304, as described in association with FIGS. 3D and 3E. Spacings 436 may have a width substantially equal to the thickness of second release layer 418, described in association with FIG. 4C. In one embodiment, the width of each of the spacings 436 is in the range of 100-500 nanometers.

Figure 4J:
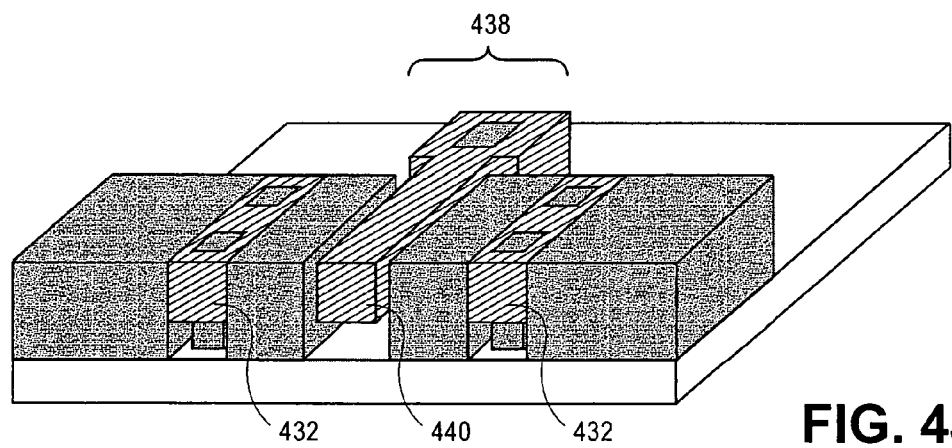

Referring to FIG. 4J, patterned second release layer 416 is finally removed to provide MEMS structure 438 having a suspended portion 440 above substrate 402 and in between coupled electrodes 432. Patterned second release layer 416 may be removed by any process used to remove first and second release layers 306 and 304, as described in association with FIGS. 3D and 3E. The spacing surrounding suspended portion 440 may be any dimension suitable to satisfy a MEMS application. In one embodiment, suspended portion 440 is suspended at a distance in the range of 0.1-5 microns above substrate 402.

Figure 5A:
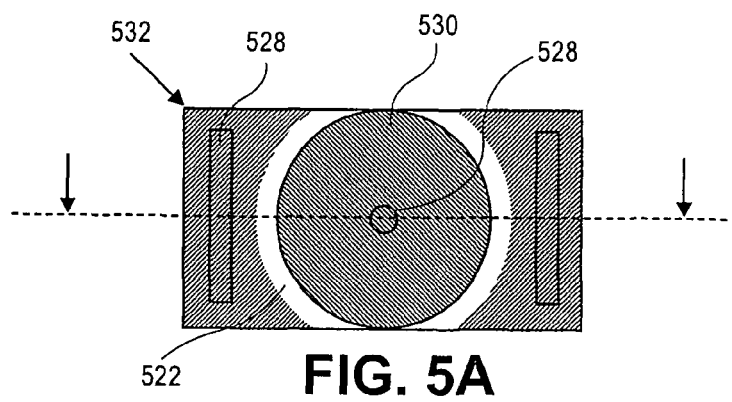
FIGS. 5A-C illustrate cross-sectional views representing a series of steps in a dual release layer approach that protects an underlying interconnect dielectric layer during fabrication of a MEMS structure having a member suspended above a substrate and between a pair of electrodes, in accordance with an embodiment of the present invention.
Figure 5A:
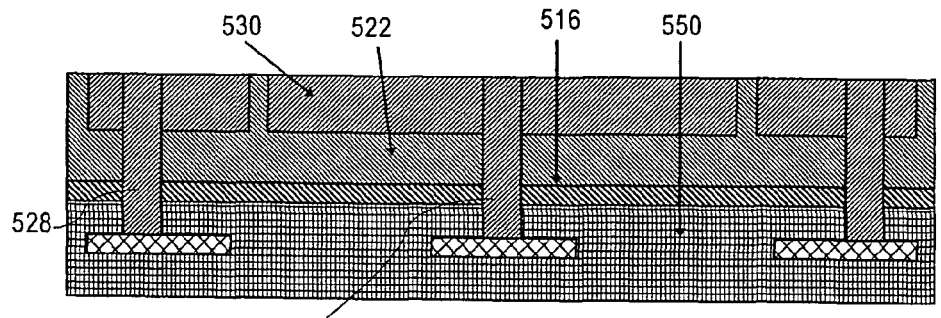
Figure 5B:
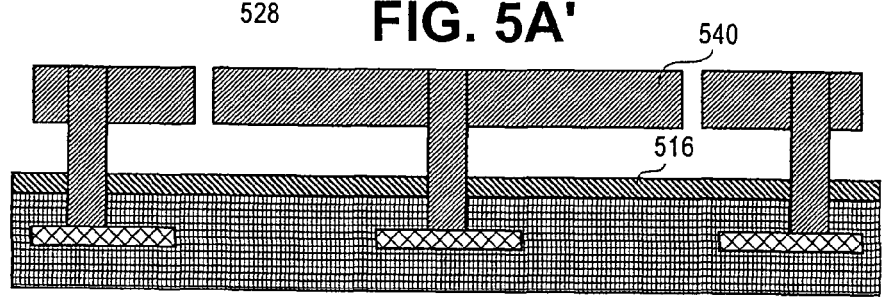
Figure 5C:
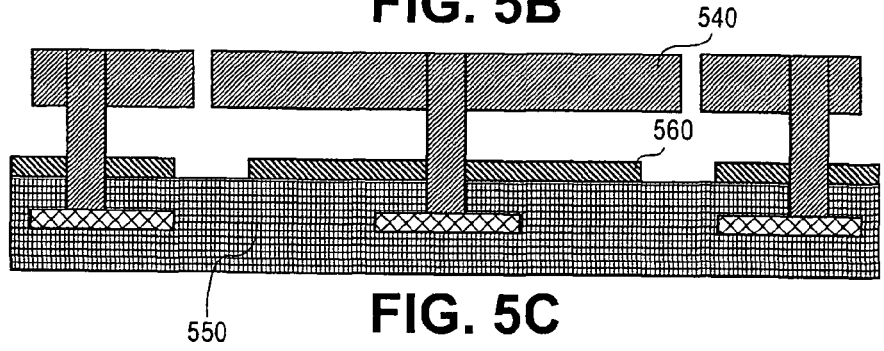

The dimensions of the underlying release layer need not be restricted to the height at which a resonating member will be suspended above a substrate. Instead, the dimensions selected for a dual release layer approach may be targeted to protect the structures already formed during release of the resonating member. FIGS. 5A-C illustrate cross-sectional views representing a series of steps in a dual release layer approach that protects an underlying interconnect dielectric layer during fabrication of a MEMS structure having a member suspended above a substrate and between a pair of electrodes, in accordance with an embodiment of the present invention.

Referring to FIGS. 5A and 5A', which are respective top down and cross-sectional views of the same structure, a coupled member 530 is provided between a pair of coupled electrodes 532. Coupled member 530 and the pair of coupled electrodes 532 are connected with an underlying substrate via couplers 528. A first release layer 522 is provided between coupled member 530 and the pair of coupled electrodes 532 and above a second release layer 516. Second release layer 516 covers interconnect dielectric layer 550, which comprises a top portion of an underlying integrated circuit stack. In accordance with an embodiment of the present invention, the thickness of second release layer 516 is less than the height at which coupled member 530 will be suspended above interconnect dielectric layer 550, as depicted in FIG. 5A. Coupled member 530, coupled electrodes 532, couplers 528, first release layer 522 and second release layer 516 may be comprised of any material described in association with coupled member 430, coupled electrodes 432, couplers 428, lateral release layer 422 and patterned first release layer 416, respectively, from FIGS. 4A-J. Interconnect dielectric layer 550 may be comprised of any material described in association with possible top insulator layers of substrate 302 from FIG. 3A. In a specific embodiment, coupled member 530, coupled electrodes 532 and couplers 528 are comprised of polycrystalline silicon/germanium, first release layer 522 is comprised of silicon dioxide, second release layer 516 is comprised of germanium and interconnect dielectric layer 550 is comprised of silicon dioxide.

Referring to FIG. 5B, first release layer 522 is removed to provide suspended portion 540. First release layer 522 may be removed by any technique suitable to complete the removal without impacting the material of coupled member 530, coupled electrodes 532 and couplers 528. Furthermore, first release layer may be removed by any technique suitable to complete the removal without stiction occurring between coupled member 530 and coupled electrodes 532. Thus, in accordance with an embodiment of the present invention, coupled member 530, coupled electrodes 532 and couplers 528 are comprised of polycrystalline silicon/germanium and first release layer 522 is comprised of silicon dioxide and is removed with a vapor etchant utilizing steam and HF vapor. In one embodiment, the lateral etch rate of first release layer 522 is approximately 0.5 microns/min. In a specific embodiment, interconnect dielectric layer 550 is also comprised of silicon dioxide, but is protected during the removal of first release layer 522 by second release layer 516, as depicted in FIG. 5B.

Referring to FIG. 5C, portions of second release layer 516 are removed to provide discontiguous artifact layer 560. Portions of second release layer 516 may be removed by any technique suitable to remove electrical shorts between coupled member 530 and coupled electrodes 532. Furthermore, portions of second release layer 516 may be removed to provide discontiguous artifact layer 560 in sufficiently short duration to only negligibly impact the material of coupled member 530, coupled electrodes 532, couplers 528 and interconnect dielectric layer 550. In a specific embodiment, coupled member 530, coupled electrodes 532 and couplers 528 are comprised of polycrystalline silicon/germanium, interconnect dielectric layer 550 is comprised of silicon dioxide and second release layer 516 is comprised of germanium and is removed with an etchant comprised of aqueous $H_2O_2$. Thus, the silicon/germanium member 530 which requires a substantial undercut etch to be released to form suspended portion 540 is not attacked by the first etchant used to remove first release layer 522. The silicon/germanium member 530 is then only minimally exposed to a potentially impactful second etch that is used to remove portions of second release layer 516, which was intact to protect interconnect dielectric layer 550 during the removal of first release layer 522.

Thus, a method to form a MEMS structure has been disclosed. In an embodiment, a structure having a first release layer between a substrate and a member is provided. A second release layer is adjacent to a sidewall of the member. In a specific embodiment, the second release layer has sub-lithographic dimensions. At least a portion of each of the first and the second release layers is then removed. In one embodiment, the member is formed by a damascene process. In another embodiment, the member is formed by a subtractive process. In a specific embodiment, all process steps used to form the MEMS structure are carried out at a temperature less than approximately 450° C.

What is claimed is:

1. A method of fabricating a MEMS structure, comprising:
providing a structure having a first release layer between a substrate and a member and having a second release layer adjacent to a sidewall of said member, wherein said member comprises silicon/germanium, wherein both said first and second release layers are comprised of greater than 98% germanium atoms, and wherein the difference in concentration of boron dopant impurity atoms between said first and second release layers is at least $1\times10^{19}$ atoms/cm$^3$; and
removing at least a portion of each of said first and said second release layers selective to said member.

2. The method of claim 1 wherein removing the at least said portion of each of said first and said second release layers suspends a portion of said member.

3. The method of claim 2 wherein removing the at least said portion of each of said first and said second release layers provides a resonating member.

4. The method of claim 1, wherein said member comprises a germanium concentration approximately in the range of 50-70% and comprises boron dopant impurity atoms with a total atomic concentration approximately in the range of $1\times10^{18}$-$5\times10^{20}$ atoms/cm$^3$.

5. A method of fabricating a MEMS structure, comprising:
providing a substrate;
forming a first release layer above said substrate;
forming a first structural layer above said first release layer;
patterning said first structural layer to form a member;
patterning said first release layer to form a patterned first release layer, wherein said member is used as a mask to pattern said first release layer; and, subsequently,
forming a second release layer adjacent to a sidewall of said member, wherein said first and second release layers are comprised of different materials; and, subsequently, forming a second structural layer adjacent to said second release layer; and removing at least a portion of each of said patterned first release layer and said second release layer.

6. The method of claim 5 wherein said first release layer is comprised of an insulating material, and wherein said second release layer is comprised of a semiconducting material.

7. The method of claim 5 wherein said first release layer is comprised of a semiconducting material, and wherein said second release layer is comprised of an insulating material.

8. The method of claim 5 wherein both said first and said second release layers are comprised of semiconducting materials.

9. The method of claim 8 wherein said first and second release layers are comprised of germanium having boron dopant impurity atoms.

10. The method of claim 9 wherein both said first and second release layers are comprised of greater than 98% germanium atoms, and wherein the difference in concentration of boron dopant impurity atoms between said first and second release layers is at least $1 \times 10^{19}$ atoms/cm$^3$.

11. The method of claim 5 wherein removing the at least said portion of each of said first and said second release layers suspends a portion of said member.

12. The method of claim 11 wherein removing the at least said portion of each of said first and said second release layers provides a resonating member.

13. A method of fabricating a MEMS structure, comprising:

providing a substrate;

forming a first release layer above said substrate;

forming a first structural layer above said first release layer;

patterning said first structural layer to form a member and a pair of electrodes, wherein each electrode is on either side of said member;

patterning said first release layer to form a patterned first release layer, wherein said member and said pair of electrodes are used as a mask to pattern said first release layer; and, subsequently, forming a second release layer over said member and said pair of electrodes;

patterning said second release layer to form a patterned second release layer adjacent to a sidewall of said member but not adjacent to any sidewall of said pair of electrodes; and, subsequently, forming a second structural layer adjacent to said patterned second release layer and said pair of electrodes; and removing at least a portion of each of said patterned first and second release layers.

14. The method of claim 13 wherein said first and second release layers are comprised of different materials.

15. The method of claim 14 wherein said first release layer is comprised of an insulating material, and wherein said second release layer is comprised of a semiconducting material.

16. The method of claim 14 wherein said first release layer is comprised of a semiconducting material, and wherein said second release layer is comprised of an insulating material.

17. The method of claim 14 wherein both said first and said second release layers are comprised of semiconducting materials.

18. The method of claim 17 wherein said first and second release layers are comprised of germanium having boron dopant impurity atoms.

19. The method of claim 18 wherein both said first and second release layers are comprised of greater than 98% germanium atoms, and wherein the difference in concentration of boron dopant impurity atoms between said first and second release layers is at least $1 \times 10^{19}$ atoms/cm$^3$.

20. The method of claim 13 wherein removing the at least said portion of each of said first and said second release layers suspends a portion of said member.

21. The method of claim 20 wherein removing the at least said portion of each of said first and said second release layers provides a resonating member.

\* \* \* \* \*